(12) United States Patent
Aebi et al.

(10) Patent No.: US 6,285,018 B1
(45) Date of Patent: Sep. 4, 2001

(54) ELECTRON BOMBARDED ACTIVE PIXEL SENSOR

(75) Inventors: Verle W. Aebi, San Mateo County, CA (US); John James Boyle, Worcester County, MA (US)

(73) Assignees: Intevac, Inc., Santa Clara, CA (US); Charles Stark Draper Laboratory Inc., Cambridge, MA (US)

( * ) Notice: Subject to any disclaimer, the term of this patent is extended or adjusted under 35 U.S.C. 154(b) by 0 days.

(21) Appl. No.: 09/356,800

(22) Filed: Jul. 20, 1999

(51) Int. Cl.[7] .................................................. H01L 31/062
(52) U.S. Cl. ..................................... 250/214.1; 250/208.1; 250/214 VT; 257/228
(58) Field of Search ........................... 250/208.1, 214 R, 250/214.1, 214 VT; 257/228, 223, 431, 452

(56) References Cited

U.S. PATENT DOCUMENTS

| | | |
|---|---|---|
| 4,687,922 | 8/1987 | Lemonier et al. . |
| 4,760,031 | * 7/1988 | Janesick . |
| 4,822,748 | * 4/1989 | Janesick . |
| 5,268,612 | 12/1993 | Aebi et al. . |
| 5,373,320 | 12/1994 | Johnson et al. . |
| 5,374,826 | 12/1994 | LaRue et al. . |
| 5,475,227 | 12/1995 | LaRue . |
| 5,521,639 | 5/1996 | Tomura et al. . |
| 5,614,744 | 3/1997 | Merrill . |
| 5,625,210 | 4/1997 | Lee et al. . |
| 5,631,704 | 5/1997 | Dickinson et al. . |
| 5,721,425 | 2/1998 | Merrill . |
| 5,739,562 | 4/1998 | Ackland et al. . |
| 5,789,774 | 8/1998 | Merrill . |

OTHER PUBLICATIONS

FOSSUM, E. R., CMOS Image Sensors: Electronic Camera On-A-Chip, IEEE Transactions on Electronic Devices, vol. 44, No. 10, pp. 1689–1698, (1997).
Gallium Arsenide Electron Bombarded CCD Techhnology, AEBI et al., SPIE vol. 3434, pp. 37–44 (1998).

* cited by examiner

*Primary Examiner*—Stephone B. Allen
(74) *Attorney, Agent, or Firm*—Stanley Z. Cole

(57) ABSTRACT

A low light level system is described wherein electrons, created by images directed to a photocathode, directly bombard active pixel sensors. Both the active pixel sensors and the output end of the photocathode are positioned in a vacuum envelop. The electron released from the photocathode are directed to and at the active pixel sensors. The output of the active pixel sensor detector may be stored, viewed or displayed at a remote location. Various applications are described including a novel camera.

25 Claims, 4 Drawing Sheets

ELECTRON BOMBARDED ACTIVE PIXEL SENSOR

FIELD OF THE INVENTION

This invention relates to devices and methods to image or detect a useful image at low light levels utilizing an active pixel sensor in an electron bombarded mode using a photocathode for detection or imaging at low light levels.

BACKGROUND OF THE INVENTION

Cameras that operate at low light levels have a number of significant applications in diverse areas. These include, among others, photographic, night vision, surveillance, and scientific uses. Modern night vision systems, for example, are rapidly transforming presently used direct view systems to camera based arrangements. These are driven by the continued advances in video display and processing. Video based systems allow remote display and viewing, recording, and image processing including fusion with other imagery such as from a forward looking infra-red sensor. Surveillance applications are also becoming predominately video based where camera size, performance, and low light level sensitivity are often critical. Scientific applications require cameras with good photon sensitivity over a large spectral range and high frame rates. These applications, and others, are driving the need for improved low light level sensors with direct video output.

Image sensing devices which incorporate an array of image sensing pixels are commonly used in electronic cameras. Each pixel produces an output signal in response to incident light. The signals are read out, typically one row at a time, to form an image. Cameras in the art have utilized Charge Coupled Devices (CCD) as the image sensor. Image sensors which incorporate an amplifier into each pixel for increased sensitivity are known as active pixel sensors (sometimes referred to herein as APS). Active pixel sensors are disclosed, for example in U.S. Pat. No. 5,789,774 issued Aug. 4, 1998 to Merrill; U.S. Pat. No. 5,631,704 issued May 20, 1997 to Dickinson et al; U.S. Pat. No. 5,521,639 issued May 28, 1996 to Tomura et al; U.S. Pat. No. 5,721,425 issued Feb. 24, 1998 to Merrill; U.S. Pat. No. 5,625,210 issued Apr. 29, 1997 to Lee et al; U.S. Pat. No. 5,614,744 issued Mar. 25, 1997 to Merrill; and U.S. Pat. No. 5,739,562 issued Apr. 14, 1998 to Ackland et al. Extensive background on active pixel sensor devices is contained in the paper by Fossum, "CMOS Image Sensors: Electronic Camera-On-A-Chip", IEEE Transactions on Electron Devices, Vol. 44, No. 10, pp. 1689–1698, (1997) and the references therein.

In general, it is desirable to provide cameras which generate high quality images over a wide range of light levels including to extremely low light levels such as those encountered under starlight and lower illumination levels. In addition, the camera should have a small physical size and low electrical power requirements, thereby making portable, head-mounted, and other battery-operated applications practical. Active pixel sensor cameras meet the small size and low power requirements, but have poor low light level sensitivity with performance limited to conditions with 0.1 lux (twilight) or higher light levels.

Night vision cameras which operate under extremely low light levels are known in the art. The standard low light level cameras in use today are based on a Generation-III (GaAs photocathode) or Generation-II (multi-alkali photocathode) image intensifier fiber optically coupled to a CCD to form an Image Intensified CCD or ICCD camera. The scene to be imaged is focused by the input lens onto the photocathode faceplate assembly. The impinging light energy liberates photoelectrons from the photocathode to form an electron image. The electron image is proximity focused onto the input of the microchannel plate (MCP) electron multiplier, which intensifies the electron image by secondary multiplication while maintaining the geometric integrity of the image. The intensified electron image is proximity focused onto a phosphor screen, which converts the electron image back to a visible image, which typically is viewed through a fiber optic output window. A fiber optic taper or transfer lens then transfers this amplified visual image to a standard CCD sensor, which converts the light image into electrons which form a video signal. In these existing prior art ICCD cameras, there are five interfaces at which the image is sampled, and each interface degrades the resolution and adds noise to the signal of the ICCD camera. This image degradation which has heretofore not been avoidable, is a significant disadvantage in systems requiring high quality output. The ICCD sensor tends also to be large and heavy due to the fused fiber optic components. A surveillance system having a Generation-II MCP image intensifier tube is described, for example, in U.S. Pat. No. 5,373,320 issued Dec. 13, 1994 to Johnson et al. A camera attachment described in this patent converts a standard daylight video camera into a day/night video camera.

In addition to image degradation resulting from multiple optical interfaces in the ICCD camera a further disadvantage is that the MCP is a relatively noisy amplifier. This added noise in the gain process further degrades the low light level image quality. The noise characteristics of the MCP can be characterized by the excess noise factor, Kf. Kf is defined as the ratio of the Signal-to-Noise power ratio at the input of the MCP divided by the Signal-to-Noise power ratio at the output of the MCP after amplification. Thus Kf is a measure of the degradation of the image Signal-to-Noise ratio due to the MCP gain process. Typical values for Kf are 4.0 for a Generation-III image intensifier. A low noise, high gain. MCP for use in Generation-III image intensifiers is disclosed in U.S. Pat. No. 5,268,612 issued Dec. 7, 1993 to Aebi et al.

An alternate gain mechanism is achieved by the electron-bombarded semiconductor (sometimes referred to herein as EBS) gain process. In this gain process, gain is achieved by electron multiplication resulting when the high velocity electron beam dissipates its energy in a semiconductor. The dissipated energy creates electron-hole pairs. For the semiconductor silicon one electron-hole pair is created for approximately every 3.6 electron-volt (eV) of incident energy. This is a very low noise gain process with Kf values close to 1. A Kf value of 1 would indicate a gain process with no added noise.

The electron-bombarded semiconductor gain process has been utilized in a focused electron bombarded hybrid photomultiplier tube comprising a photocathode, focusing electrodes and a collection anode consisting of a semiconductor diode disposed in a detector body as disclosed in U.S. Pat. No. 5,374,826 issued Dec. 20, 1994 to LaRue et al. and U.S. Pat. No. 5,475,227 issued Dec. 12, 1995 to LaRue. The disclosed hybrid photomultiplier tubes are highly sensitive but do not sense images.

The electron-bombarded semiconductor gain process has been used to address image degradation in the ICCD low light level camera. A back illuminated CCD is used as an anode in proximity focus with the photocathode to form an Electron Bombarded CCD (EBCCD). Photoelectrons from the photocathode are accelerated to and imaged in the back illuminated CCD directly. Gain is achieved by the low noise electron-bombarded semiconductor gain process. The EBCCD eliminates the MCP, phosphor screen, and fiber optics, and as a result both improved image quality and increased sensitivity can be obtained in a smaller sized camera. Significant improvement of the degraded resolution and high noise of the conventional image transfer chain has been realized with the EBCCD. An EBCCD is disclosed in U.S. Pat. No. 4,687,922 issued Aug. 18, 1987 to Lemonier. Extensive background on EBCCDs is contained in the paper by Aebi, et al, "Gallium Arsenide Electron Bombarded CCD Technology", SPIE Vol. 3434, pp. 37–44, (1998) and references cited therein.

Optimum low light level EBCCD performance requires a specialized CCD. The CCD is required to be backside thinned to allow high electron-bombarded semiconductor gain. The CCD cannot be used in a frontside bombarded mode as used in a standard CCD camera as the gate structures would block the photoelectrons from reaching the semiconductor and low electron-bombarded semiconductor gains would be obtained at moderate acceleration voltages High acceleration voltages required to penetrate the gate structures would cause radiation damage to the CCD and shorten CCD operating life. Also a frame transfer format is required where the CCD has both an imaging region and a store region on the chip. The image and store regions are of approximately the same size. A frame transfer format is required for two reasons. First it is essential that the CCD imaging area have high fill factor (minimum dead area) if possible. The frame transfer CCD architecture satisfies this requirement. The interline transfer CCD architecture would result in substantial dead area (of order 70–80%). Any reduction in active area will result in lost photoelectrons. This is equivalent to a reduction in photocathode quantum efficiency or sensitivity. At the lowest light levels (starlight or overcast starlight), low light level camera performance is dictated by the photon statistics. It is essential that the maximum number of photons be detected by the imager for adequate low light level resolution and performance. Second a frame transfer format allows signal integration to occur during the readout of the store region in addition to any integration period. This allows charge to be integrated almost continuously maximizing the collected signal.

EBCCD cameras have several other disadvantages. The frame transfer CCD architecture has the serious disadvantage for the EBCCD application of essentially doubling the size of the required vacuum envelope due to the requirement for image and store regions on the CCD. This requirement also means that the frame transfer CCD chip is over twice the size of the image area. This substantially increases the cost of the COD relative to interline transfer CCDs or active pixel sensor chips as fewer chips can be fabricated per silicon wafer. EBCCD based cameras also have the disadvantage of backside illumination of the CCD which necessitates specialized processing to thin the semiconductor and passivate the back surface for high electron-bombarded semiconductor gain. This processing is not standard in the silicon industry and substantially increases the EBCCD manufacturing cost. The EBCCD cameras consume several watts of power due to the CCD clocking requirements and require external electronics for a complete camera. The size of the external camera electronics presents an obstacle to applications that would benefit from miniaturization of the camera. Finally CCDs require specialized semiconductor processing lines which are not compatible with mainstream CMOS semiconductor fabrication technology. This further increases the cost of CCD based cameras.

SUMMARY OF THE INVENTION

It is the object of the present invention to eliminate these various disadvantages in the prior art and provide improved low light level imaging systems and corresponding processes. This is achieved by utilizing an active pixel sensor CMOS imager in an electron bombarded mode in a vacuum envelope with a photocathode sensor. The electron bombarded active pixel sensor constitutes a complete low light level camera with the addition of a lens, housing, power, and a control interface.

It is accordingly another object of this invention to describe an improved low light level camera which makes use of an active pixel sensor CMOS imager and direct electron bombardment.

It is yet another object of this invention to describe a novel chip or imaging circuit to facilitate the creation of lightweight structures when this imaging circuit is used which considerably reduces power requirements and enable improved devices for various low light level imaging applications.

Further features and embodiments of the present invention will become more apparent from the following detailed description when read in conjunction with the accompanying drawings.

DETAILED DESCRIPTION OF THE INVENTION

Figure 1:
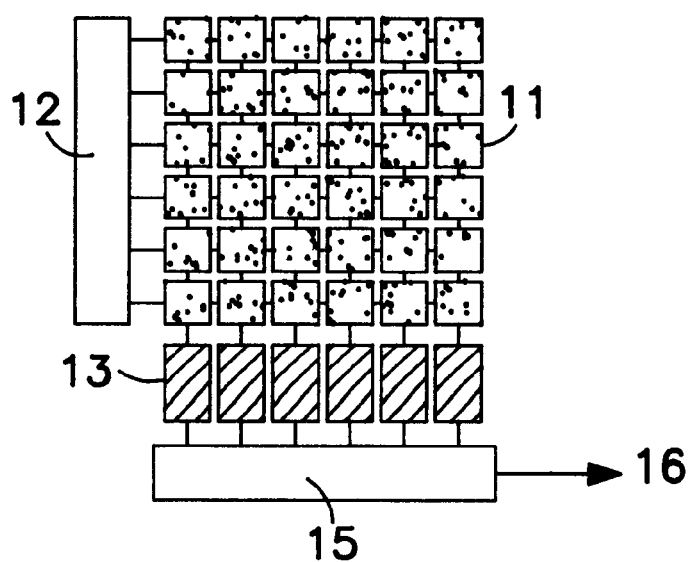
FIG. 1 is a schematic illustration of the architecture of an active pixel sensor chip.

An active pixel sensor chip is illustrated in FIG. 1. The architecture of a photogate active pixel sensor is shown in FIG. 2 and of a photodiode active pixel sensor in FIG. 3.

Referring now to FIG. 1, there is shown a pixel array 11 controlled by a logic timing and control circuit 12. Signals are processed by signal processors 13 which may comprise an analog signal processor and analog to digital converters. A column select control circuit is illustrated as 15 and the output signal is shown feeding from the active pixel sensor by an arrow designated 16. The output at 16 may comprise a digital or analog signal depending on the system in which the active pixel sensor is being used or to which the signal is being fed.

Two basic pixel architectures are used to form the individual pixels in pixel array, 11. The first architecture for the pixel is the photogate pixel structure. The second pixel architecture is the photodiode pixel structure.

Figure 2:
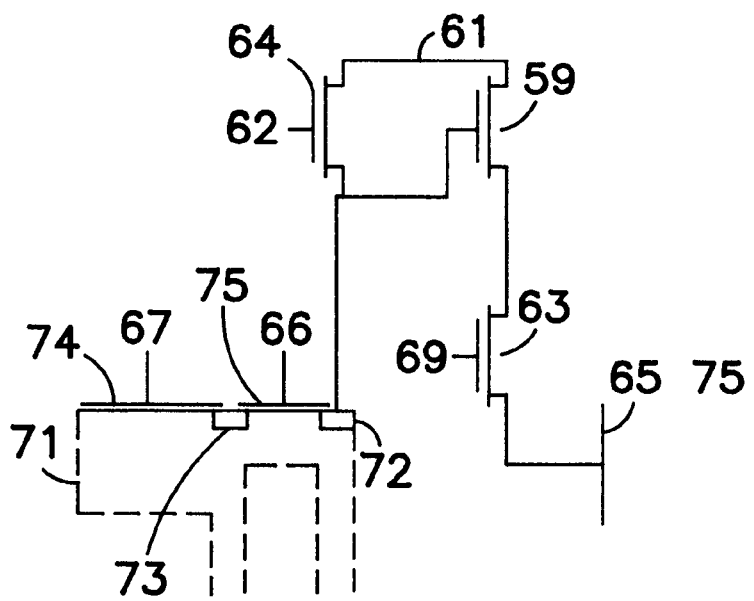
FIG. 2 is a schematic illustration of the architecture of a photogate type active pixel sensor.

In FIG. 2 there is illustrated a photogate type pixel structure. The photoelectrons generated by the incident photon flux are integrated under photogate, 74. The photogate, which is similar to a gate formed on a CCD, comprises a polysilicon electrode on a dielectric layer over the charge storage region. The photogate is biased by the voltage source applied to 67. The photogate is separated from the floating output diffusion node 72, by the transfer gate 75 and the bridging diffusion 73. The transfer gate is biased by the voltage source applied to 66. The potential wells generated by these applied bias voltages in the semiconductor are illustrated by dotted line 71 with the photogate voltage bias applied to allow charge integration under the photogate. For readout the floating output diffusion node is reset by the voltage source applied to 61 (also referred to as Drain Voltage) which is applied when gate 62 of the normally off reset transistor 64 is pulsed by a voltage source to turn the transistor on and set the floating output diffusion to the drain voltage. The photogate voltage is then pulsed momentarily to transfer any collected charge to the floating output diffusion node 72. The photogenerated charge is sensed when the row select transistor 63 is turned on by applying a voltage pulse to transistor gate 69. The charge is amplified by the source follower transistor 59 and the voltage is sensed by the analog signal processing circuit 13 (see FIG. 1) connected to the column bus 65. The photogate structure (FIG. 2), as compared to the photodiode pixel structure illustrated in FIG. 3, has the advantage of lower noise readout due to the ability to integrate correlated double sampling readout into the pixel as the measured voltage by the source follower transistor is the difference between the reset level and the signal level, but has lower optical sensitivity due to optical absorption in the intervening polysilicon layer In FIG. 3 there is illustrated a photodiode type pixel structure. The photoelectrons generated by the incident photon flux are collected on the photodiode 20 which has been reverse biased by the voltage source applied to 21 (also referred to as Drain Voltage) which is applied when gate 22 of the normally off reset transistor 24 is pulsed by a voltage source to turn the transistor on and set the photodiode bias to the drain voltage. The photogenerated charge is sensed when the row select transistor 23 is turned on by applying a voltage pulse to transistor gate 29. The charge is amplified by the source follower transistor 19 and the voltage is sensed by the analog signal processing circuit 13 (see FIG. 1) connected to the column bus 25.

Active pixel sensor based cameras have significant advantages over charge coupled device based cameras. These advantages include: substantially higher levels of electronics integration with the majority of the required camera electronics integrated on the APS chip where the electronics include integrated timing and control electronics; an order of magnitude or greater reduction in power requirements; use of low cost standard CMOS fabrication technology; substantial overall reduction in camera volume; and versatile image readout. Image readout modes can include window readout of subregions of the overall array or skip readout where every $n^{th}$ pixel is readout (n being an integer). In both of these modes only a fraction of the pixels are readout enabling higher frame rates.

Figure 4:
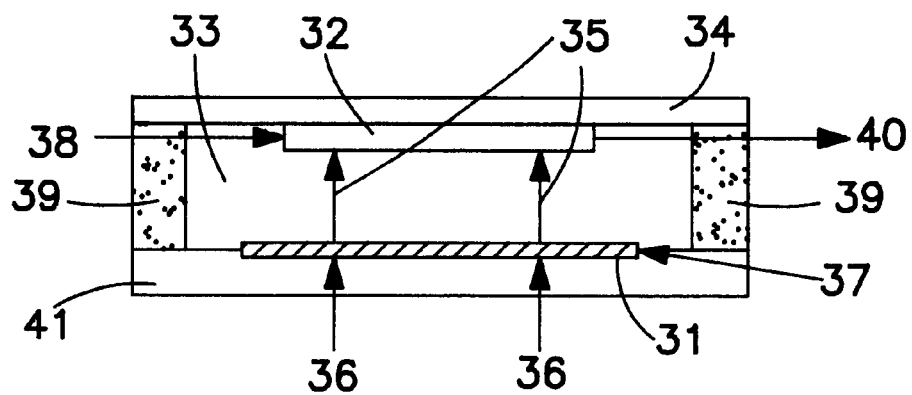
FIG. 4 is a schematic illustration showing an electron bombarded active pixel sensor in a vacuum tube arrangement in accordance with the present invention.

Referring now to FIG. 4, there is shown an electron bombarded active pixel sensor vacuum system or tube 33 in accordance with this invention. This system may comprise photocathode 31, preferably a III-V semiconductor photocathode such as GaAs or an InP/InGaAs Transferred Electron photocathode for high performance applications, in proximity focus with a specialized active pixel sensor chip 32 which forms the anode of tube 33. Photoelectrons 35 are emitted from photocathode 31 in response to incident light illustrated as arrows designated 36. These electrons are accelerated by an applied voltage to sufficient energy to allow electron gain in the chip in which the active pixel sensor 32 is found. Typically the acceleration voltage 37 applied to photocathode 31 is negative with respect to the chip. This permits biasing of the chip to be near ground potential for easy interfacing with other components. Control signals and bias voltages 38 are applied to active pixel sensor 32 and a video output signal 40 may be taken off sensor 32. The base of tube 31, in FIG. 4 is a transparent faceplate 41 and tube sidewalls 39 extend between the transparent faceplate 41 on which the photocathode 31 is positioned and header assembly 34, on which the APS chip is positioned. The header assembly 34, also provides means for electrical feedthroughs for applying voltages 38 to the APS chip and for video output signals 40 from the APS chip.

Electron bombarded sensor gain is preferably high enough to overcome readout noise. This will allow detection of a single photoelectron.

The active pixel sensor for this application is modified for electron sensitivity using the electron-bombarded semiconductor mechanism. The preferred embodiment is a frontside electron bombarded mode to eliminate the requirement for backside thinning and passivation of the active pixel sensor chip. The frontside electron bombarded approach will result in the lowest cost electron bombarded active pixel sensor component. However, it is important that low light level performance not be significantly compromised with this approach. This implies that the photodiode occupies a substantial percentage of the pixel area to allow a high fill factor. Fill factors in excess of 50% are desirable for good low light level performance. A 50% fill factor would result in an equivalent low noise sensitivity for the electron bombarded active pixel sensor to an image intensifier CCD system using a Generation-III image intensifier.

An electron bombarded active pixel sensor component incorporating a frontside electron bombarded active pixel sensor chip preferably uses a photodiode active pixel architecture. This is because all overlying materials can be removed to the photodiode semiconductor surface with this pixel arrangement. Intervening materials between the semiconductor and the incident electrons could absorb the electrons and dissipate the electron energy resulting in low electron-bombarded semiconductor gain or requiring high acceleration voltages. A photogate active pixel sensor architecture has the disadvantage of requiring overlying polysilicon or other materials which would interfere with collection of the incident photoelectrons for typical acceleration energies (2 keV). The incident electrons may also cause radiation damage to the dielectric—Silicon interface resulting in short operation life for a frontside electron bombarded photogate active pixel sensor chip.

The photodiode is desired to have high electron-bombarded semiconductor gain at relatively low electron acceleration voltages (preferably less than 2,000 volts). This minimizes radiation damage to the CMOS imager due to x-rays generated by electron bombardment of the silicon or overlying structures on the active pixel sensor chip. Low voltage operation is also desirable to enable easy gating of the tube by control of the applied voltage. Furthermore it is desirable to shield adjacent CMOS circuitry from the electron bombardment by providing an overlying protective layer with conductivity to allow any charge accumulation to be drained, preventing damage due to electrostatic discharge. The shielding also reduces x-ray dose to the underlying CMOS circuitry.

High electron-bombarded semiconductor gain at low electron acceleration voltages requires elimination of any overlayers from the photodiode surface and good passivation of the semiconductor surface to minimize carrier recombination at the surface. This passivation can be achieved by a number of techniques known to the art. One standard technique is to form a thin doped region at the semiconductor surface. The thickness of this doped region is desired to be less than or equal to the electron range in the solid, preferably substantially less, at the desired operating voltage. For operation at 2,000 volts the electron range is approximately 600 Å for silicon. The approximate electron range in a solid is given by $R_G$ the Gruen range where $R_G = 400 \, E_b^{1.75}/\rho$. $R_G$ is in angstroms, $E_b$ is in keV and $\rho$ is in gm/cm$^3$. For silicon the bulk density, $\rho$, is 2.33 g/cm$^3$.

The doped region is doped to have a greater free carrier concentration of the same carrier type than the underlying region. This increase in doping concentration forms a potential barrier which prevents the desired minority carriers from reaching the surface where they could recombine and not be collected by the reverse biased photodiode. Other techniques to form a potential barrier to prevent minority carriers from reaching the surface are known in the art. Passivation techniques are disclosed, for example, in U.S. Pat. No. 4,822,748 issued Apr. 18, 1989 to Janesick et al; and in U.S. Pat. No. 4,760,031 issued Jul. 26, 1988 to Janesick.

An alternate embodiment of this invention utilizes a backside bombarded active pixel sensor chip. In this embodiment the APS chip is mounted face down and the silicon substrate is mechanically and chemically removed leaving a thinned active pixel sensor chip A disclosure of how to thin the substrate in connection with CCDs appears in U.S. Pat. No. 4,687,922. This described method may also be used to thin the backside of an APS structure and is incorporated herein by reference. In general back-thinning may be accomplished by thinning the substrate under sensitive areas.

Figure 3:
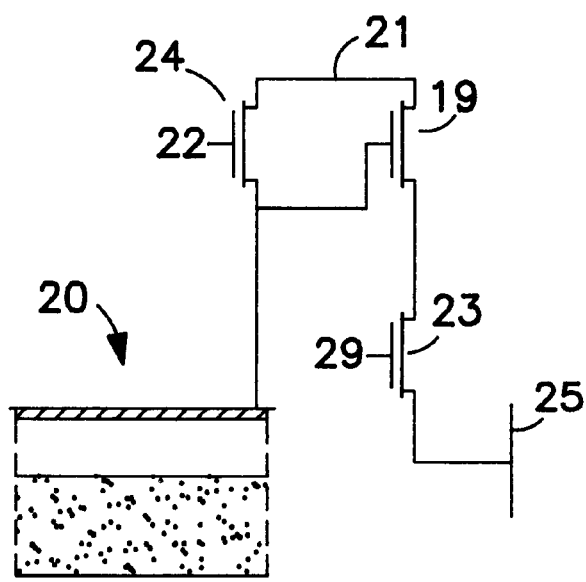
FIG. 3 is a schematic illustration of the architecture of a typical photodiode type of active pixel sensor.
Figure 5:
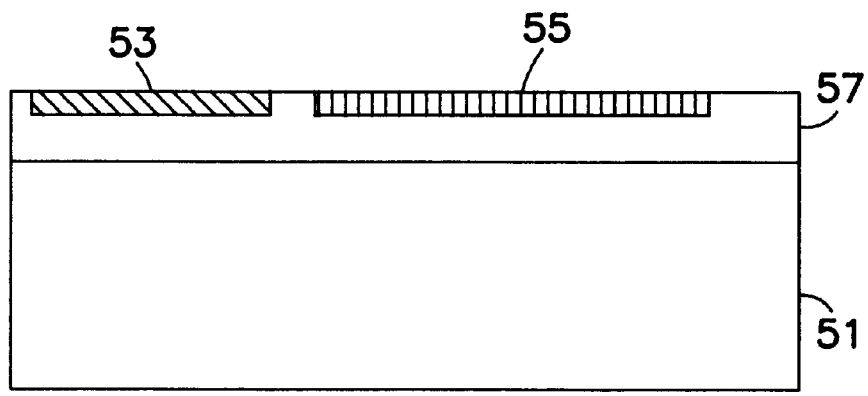
FIG. 5 is a cross sectional view of a photodiode pixel structure.

A cross section of a photodiode pixel structure is illustrated in FIG. 5 prior to thinning of the substrate. The photodiode, 20 in FIG. 3, is indicated as region 55 in FIG. 5. The CMOS circuitry composed of the associated transistors in the pixel (transistors 19, 22, and 23 in FIG. 3) are contained in region 53. First a rapid isotropic etching step is performed to remove a major portion of substrate 51. For example, if the substrate is approximately 400 μm initially, this etch step will proceed until approximately 380 μm of the substrate layer 51 has been etched away leaving a thin layer of approximately 20 μm of substrate material. This etch step is performed with the aid of a solution of nitric acid, acetic acid and hydrofluoric acid in proportions of 5:3:3 or through the use of similar solutions known in the art. By rotating the substrate during this etch a final thickness of good consistency will be produced. A slow etch is then carried out in order to remove the remaining substrate material, stopping the etch in layer 57. This leaves a layer which is on the order of 5 μm thick. This etch is done with the aid of a solution of nitric acid, acetic acid and hydrofluoric acid in proportions of 3:8:1, in the presence of hydrogen peroxide in the ratio of 5 ml per 350 ml of acid solution or using similar solutions known in the art. Doping differences between layers 57 and 51 are utilized to obtain etch selectivity. Etching is performed to assure good uniformity in thickness. After thinning of the active pixel sensor the back surface is passivated to reduce the surface recombination velocity and ensure high electron bombarded gain at low operation voltages (<2 kV).

Substrate removal and backside passivation enables the photons and photoelectrons to be absorbed at a point sufficiently close to the sources of potential and charge collection which in this embodiment is performed with a reverse biased photodiode to allow charges created to reach their destinations without bulk or surface recombination or lateral diffusion.

In the exposure mode, electrons from the photocathode are incident on the back face of the chip, similar to the case for the previously described EBCCD. Although this approach requires additional processing to mount and thin the APS chip, advantages are that 100% fill factor may be obtained as no intervening structures are on the electron bombarded surface and potentially all of the incident photoelectrons may be detected by building in the appropriate electrostatic potential distribution into the solid by manipulation of doping profiles in ways known in the art. Backside exposure and backside thinning is compatible with either the photodiode or photogate pixel structures. The potential distribution in layer 57 can be structured to deflect the generated electrons away from the CMOS circuitry to the photodiode or photogate structure. This allows the ultimate in low light level sensitivity.

A less preferred, alternate embodiment of this invention utilizes a frontside bombarded active pixel sensor chip coated with an electron-to-light conversion layer. This is now discussed in connection with FIG. 6 hereof.

Figure 6:
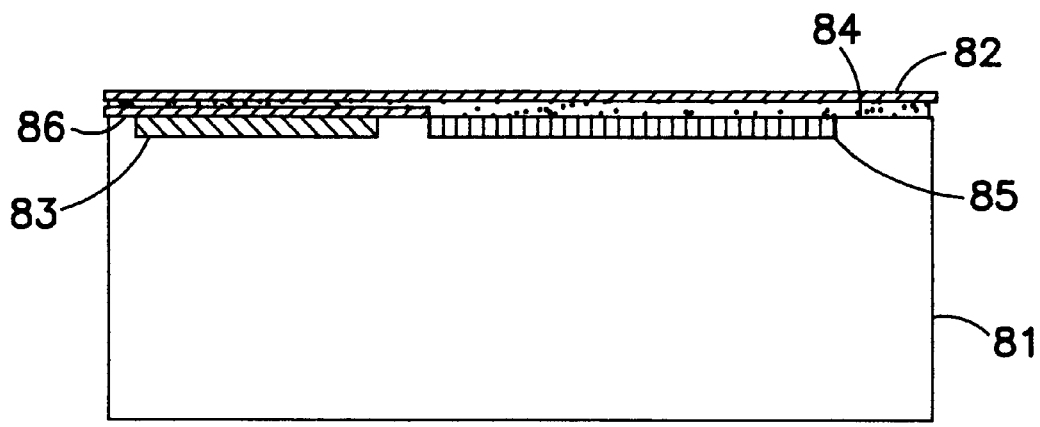
FIG. 6 is a schematic illustration of an active pixel sensor with an overlying light conversion layer; and, FIG. 7 is an showing of an imaging system or camera illustrating an application of this invention.

This approach has the advantage of utilizing standard chips which have not been modified for direct electron sensitivity. An active pixel sensor of this type is shown in FIG. 6. Referring now to FIG. 6, there is shown a cross section of an active pixel sensor with a front side electron-to-light conversion layer. The photodiode (20 in FIG. 3) or photogate (74 in FIG. 2) is indicated as region 85 in FIG. 6. The CMOS circuitry composed of the associated transistors or gates in the pixel (transistors 19, 22, and 23 in FIG. 3 or transistors and gates 75, 64, 63, 59 in FIG. 2) are contained in region 83. These structures are contained in substrate 81. An optical shield layer 86, is used to block light generated in electron-to-light conversion layer 84 from entering region 83. Layer 86 may be fabricated from aluminum or other highly reflective metal to allow generated light to be reflected back into the light conversion layer where further reflections may result in the light reaching region 85 where it will be detected by the photodiode or photogate structure. The light conversion layer, 84, is coated with an optically reflective, electrically conductive layer 82. Layer 82 forms a conductive anode layer for the electron bombarded active pixel sensor and allows the incident electrons to be collected and to drain off to the tube bias voltage supply. Layer 82 also blocks light generated in layer 84 from reaching the photocathode. If light from this layer reached to photocathode it would result in optical feedback and would add excess noise to the detected image. Typically layer 82 must attenuate light reaching the photocathode from layer 84 by at least three orders of magnitude or more to minimize optical feedback effects.

In this embodiment a standard active pixel sensor chip may be used with application of the electron-to-light conversion layer and associated structure shown in FIG. 6. Electrons accelerated from the cathode to anode are converted to photons by the conversion layer which are detected by the APS pixel. This screen would be deposited directly on the active pixel sensor chip. In this approach layer 82 would be fabricated using aluminum which has the properties of good optical reflectivity and good electron transmission at relatively low incident electron energies. Optical reflectivity is important to allow more of the generated light to reach the photogate or photodiode for greater sensitivity. In this case light which strikes layer 82 may be reflected back to the pixel and be detected, increasing screen efficiency. Layer 84 may be fabricated using high efficiency phosphors such as P20 or P43, which emit in the green. Further optimization may be done by choosing a phosphor that emits light with a wavelength which matches the peak sensitvity wavelength of the active pixel sensor. The conversion layer may comprise a standard metallized phosphor screen of the type known in the art.

Disadvantages of the approach using a conversion layer at the surface are lower resolution and higher noise as compared to the direct detection of electrons by the active pixel sensor chip. Lower resolution results from light scattering in the light conversion layer which will result in pixel-to-pixel cross talk, reducing the modulation transfer function. Higher noise results from degradation in the excess noise factor due to the additional conversion step now incorporated with the light conversion screen. Higher noise will also result as the electron acceleration voltage will need to be substantially higher to achieve good overall conversion gain. This is due to inefficiency in the light conversion layer which typically requires voltages greater than 4 kV for good conversion efficiency. The high acceleration voltage will greatly increase the x-ray generation rate. X-rays detected by the photocathode will result in large noise pulses. The x-rays may also significantly shorten the active pixel sensor chip lifetime due to radiation damage effects. Optimizing the light conversion structure for maximum efficiency, allowing lower voltage operation by using the techniques previously described can reduce noise effects.

Figure 7:
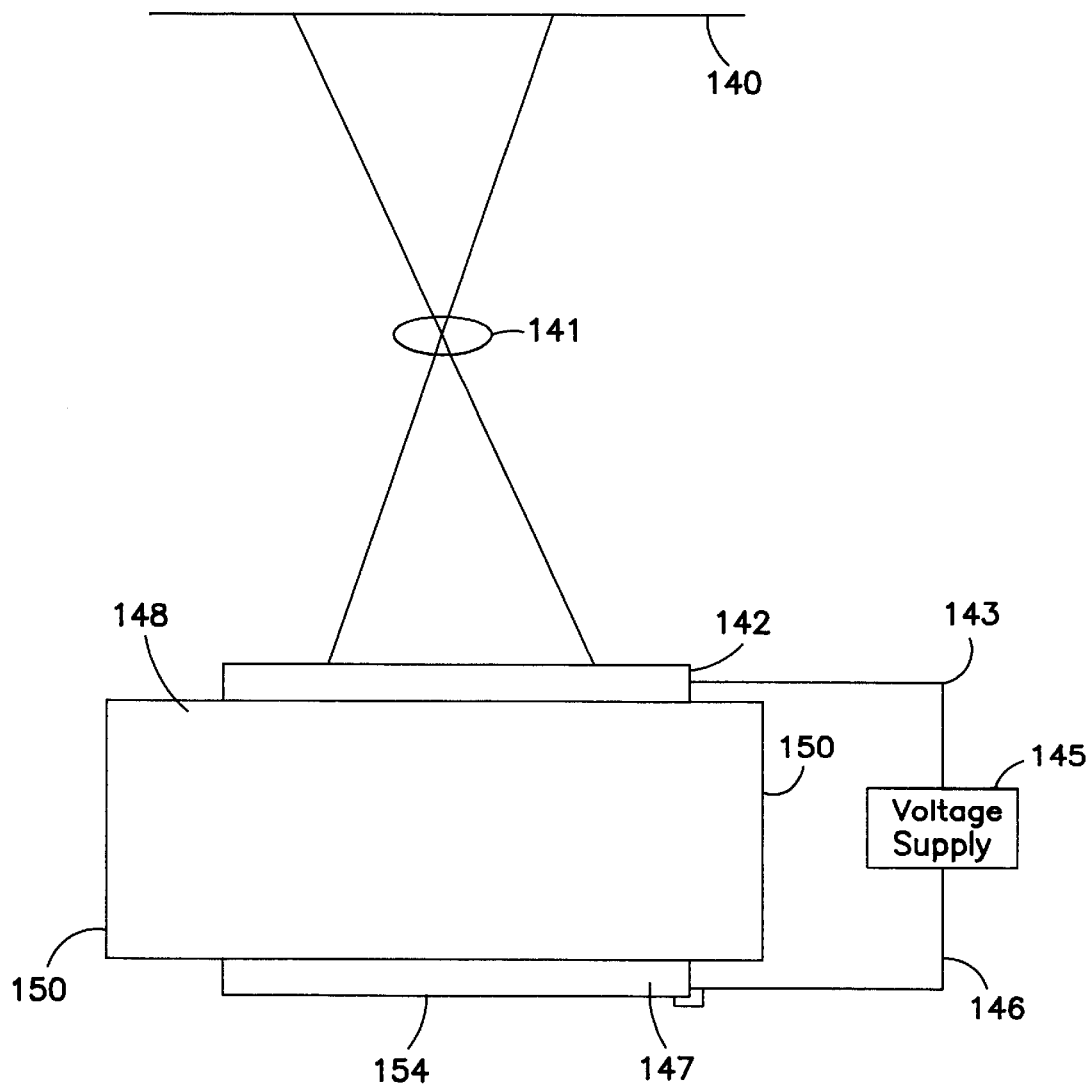

Referring now to FIG. 7 there is shown an illustration of a camera in accordance with this invention intended to be illustrative of any number of different imaging systems. In this figure, 140 represents an image which is focused through lens 141 onto photocathode 142. There is connected to photocathode 142 a voltage lead 143 from voltage source 145. Voltage source 145 is also connected through lead 146 to active pixel sensor 147. A vacuum chamber 148 separates photocathode 142 from active pixel sensor 147. Walls 150 indicate the outer sealed walls of the chamber The camera arrangement shown in this figure is intended to illustrate a system useful in connection with this invention. What should be readily appreciated is the camera system may take many forms and may be modified as is known in the art for a particular application. Thus in a surveillance system, the image being captured may comprise the inside or the outside of a building area with the camera lens focusing images onto the photocathode which in turn in space wise configuration transfers the image to the active pixel sensor which in turn may feed an output cathode ray system or alternate display for viewing of the image. As will be readily apparent, the image 140 may be viewed at a remote location or on a display integrated in the system to which the output of the active pixel sensor is fed. Such a screen may located as shown at 154 as the output of the system.

A camera of the type illustrated is capable of imaging and reproducing images working at light levels as low as starlight but typically and preferably will be operated in brighter surroundings but such surroundings may be without adequate light for normal passage of persons at nighttime. This generally is more than adequate for most systems and needs and thus permits the setting of lower standards for certain components used in the system. In the case of applications demanding the full capability of low light level imaging such as for night vision purposes such as for helicopter applications where flying may be very low and concern may exist about accidents with either high buildings or trees or power wires, the system would be designed as illustrated and may include some of the unique approaches followed for night vision devices such as battery operations, helmet arrangements and the like.

In some scientific applications it is necessary to work in extremely dark conditions. Yet it is necessary for personnel to handle items without breakage. Night vision adjusted systems are most useful for these purposes. Other scientific applications require the ability to image light emission at very low levels or even to detect single photons. The described system is suitable for these applications.

A related application is being simultaneously filed entitled Electron Bombarded Active Pixel Sensor Camera Incorporating Gain Control, invented by Kenneth A. Costello which may be referred to showing an application of this invention.

While this invention has been described in terms of specific embodiments, it should be understood that there are various alternatives that may be employed in practicing this invention which will be apparent to those skilled in the art. It is therefore intended to broadly define this invention in terms of the following claims.

What is claimed is:

1. A vacuum device comprising:
   a photocathode in the vacuum as a wall thereof to release electrons into the vacuum when exposed to light;
   an active pixel sensor positioned in the vacuum chamber of the device in a facing relationship to said photocathode;
   a wall structure between said photocathode and said active pixel sensor sealing the vacuum chamber of said device;
   an electric field to cause electrons released into the vacuum chamber from said photocathode to move directly to said active pixel sensor; and,
   an electrical connection from said active pixel sensor extending out of said vacuum enclosure to feed signals from said sensor for use outside said vacuum.

2. The device of claim 1 in which the active pixel sensor is positioned so that the frontside of said sensor is positioned to be bombarded by electrons from said photocathode.

3. The device of claim 1 in which the active pixel sensor is positioned so that the backside of said sensor is positioned to be bombarded by electrons from said photocathode.

4. The device of claim 2 in which the front surface of said active pixel sensor is coated with an electron to light converting layer.

5. The device of claim 3 in which the substrate is back-thinned and the electrons are directed at said back thinned substrate.

6. A low light level camera comprising
   a lens to focus an input image onto an object plane,
   a photocathode at said object plane in position to be exposed to an image focused thereat,
   an active pixel sensor positioned facing said photocathode,
   a vacuum enclosure between said photocathode and said active pixel sensor to facilitate the transfer of electrons from said photocathode directly to said active pixel sensor,
   an electric field to cause electrons released from said photocathode in response to an image focused thereon to move in a spatial relationship conforming to said input image to said active pixel sensor, and
   means to feed outside of said vacuum signals to display the image received at said active pixel sensor outside of said vacuum.

7. The camera in accordance with claim 6 in which the active pixel sensor is coated with a electron to light conversion layer and in which said conversion layer is positioned so that electrons released from said photocathode directly impinge onto said conversion layer.

8. The camera in accordance with claim 6 in which the active pixel sensor is back thinned and in which the electron from said photocathode are directed to said back thinned layer of said active pixel sensor.

9. The camera in accordance with claim 6 in which a photogate is employed as part of said active pixel sensor.

10. The camera in accordance with claim 6 in which a photodiode is employed as a component of said active pixel sensor.

11. An active pixel sensor chip intended to be used within a vacuum envelope in which the back is thinned.

12. An active pixel sensor chip to be used within a vacuum envelope with an overlaying phosphor layer to convert electrons impinging on said layer to light within said vacuum envelope and a conductive anode layer overlying said phosphor layer to attenuate light outgoing from said phosphor layer and to drain electrons from the photocathode.

13. A method of recording low light level images comprising projecting an image to be recorded onto a photocathode to cause said photocathode to release electrons in a spatial configuration to the input image into a vacuum chamber, positioning an active pixel sensor at a receiving plane of the electron image within the vacuum chamber, and directing the output of said active pixel sensor out of said vacuum to a recording device.

14. A vacuum tube comprising:

a photocathode in the vacuum to release electrons into the vacuum when said photocathode is exposed to a low light image;

an active pixel sensor positioned in said tube to receive a electron image from said photocathode;

a wall structure between said photocathode and said active pixel sensor sealing said photocathode and said sensor within the vacuum chamber of said device;

an electric field to cause electrons released into the vacuum chamber from said photocathode to move directly to said active pixel sensor in image configuration; and, an electrical connection from said active pixel sensor extending out of said tube enclosure to feed signals from said sensor for use outside said tube.

15. A vacuum tube in accordance with claim 14 in which said active pixel sensor includes a photogate and in which said electron image is directed to said forward surface.

16. A vacuum tube in accordance with claim 14 in which said active pixel sensor includes a photogate and in which said electron image is directed to the backside of said active pixel sensor.

17. A vacuum tube in accordance with claim 14 in which said active pixel sensor includes a photogate and in which said electron image is directed to the backside of said active pixel sensor and in which said backside is thinned.

18. The method of claim 13 in which a backside thinned active pixel sensor is used and in which the electron image is directed to the thinned backside of said active-pixel sensor.

19. The method of claim 13 in which an active pixel sensor with an overcoating to convert electron images to light images is positioned so that the electron image from said photocathode is directed to the overcoated layer of said active pixel sensor.

20. An imaging system comprising a photosensitive layer comprising a surface area of a vacuum enclosure to receive an incoming two dimensional image and to generate photoelectrons within said vacuum enclosure in spatial conformity with said incoming image;

a pixel sensor array in a chip at a surface area of said vacuum enclosure spaced from said photosensitive layer;

an electronic circuit between said photosensitive layer and said sensor array to apply a voltage to accelerate electrons emitted from said photosensitive layer travelling to said sensor array and to generate electron bombarded sensor gain in said chip;

integrated timing and control electronics to feed electronic signals from said chip outside of said vacuum.

21. An imaging system in accordance with claim 20 in which said photosensitive layer comprises a multi-alkali photocathode.

22. An imaging system in accordance with claim 20 in which said photosensitive layer comprises a III-V semiconductor layer.

23. An imaging system in accordance with claim 20 in which said photosensitive layer comprises a transferred electron photocathode.

24. An imaging system in accordance with claim 20 in which said pixel sensor array comprises an active pixel sensor in a CMOS chip.

25. An imaging system in accordance with claim 24 in which said CMOS chip is shielded with an overlying protective conductive layer to permit charge accumulation to drain and to shield the CMOS circuitry from x-rays.

* * * * *